(12) United States Patent
Sung et al.

(10) Patent No.: US 10,811,359 B2
(45) Date of Patent: Oct. 20, 2020

(54) STACK PACKAGES RELATING TO BRIDGE DIE

(71) Applicant: SK hynix Inc., Icheon-si, Gyeonggi-do (KR)

(72) Inventors: Ki Jun Sung, Cheongju-si (KR); Kyoung Tae Eun, Seoul (KR)

(73) Assignee: Sk hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/532,772

(22) Filed: Aug. 6, 2019

(65) Prior Publication Data
US 2020/0176385 A1    Jun. 4, 2020

(30) Foreign Application Priority Data

Dec. 4, 2018 (KR) .................. 10-2018-0154770

(51) Int. Cl.
| | |
|---|---|
| *H01L 23/538* | (2006.01) |
| *H01L 25/065* | (2006.01) |
| *H01L 23/31* | (2006.01) |
| *H01L 23/14* | (2006.01) |
| *H01L 23/29* | (2006.01) |
| *H01L 23/498* | (2006.01) |
| *H01L 23/00* | (2006.01) |
| *H01L 25/07* | (2006.01) |
| *H01L 25/11* | (2006.01) |

(52) U.S. Cl.
CPC ........ *H01L 23/5385* (2013.01); *H01L 23/145* (2013.01); *H01L 23/296* (2013.01); *H01L 23/3128* (2013.01); *H01L 23/49816* (2013.01); *H01L 23/5381* (2013.01); *H01L 23/5386* (2013.01); *H01L 23/5387* (2013.01); *H01L 24/24* (2013.01); *H01L 25/0652* (2013.01); *H01L 25/071* (2013.01); *H01L 25/112* (2013.01); *H01L 2224/24137* (2013.01); *H01L 2224/24155* (2013.01)

(58) Field of Classification Search
CPC ... H01L 25/0652; H01L 25/071; H01L 25/112
See application file for complete search history.

(56) References Cited

U.S. PATENT DOCUMENTS

| | | | | |
|---|---|---|---|---|
| 4,607,968 A | * | 8/1986 | Carena ............ | B41J 13/16 400/637 |
| 5,371,654 A | * | 12/1994 | Beaman .......... | G01R 1/07307 174/16.3 |
| 5,426,563 A | * | 6/1995 | Moresco ......... | H01L 21/486 257/E23.065 |
| 5,544,017 A | * | 8/1996 | Beilin ............. | H01L 23/49838 174/255 |

(Continued)

FOREIGN PATENT DOCUMENTS

| | | |
|---|---|---|
| KR | 101236798 B1 | 2/2013 |
| KR | 1020140143056 A | 12/2014 |

*Primary Examiner* — David A Zarneke
(74) *Attorney, Agent, or Firm* — William Park & Associates Ltd.

(57) ABSTRACT

A stack package includes a first sub-package, a second sub-package stacked on the first sub-package. The first sub-package is configured to include first and second semiconductor dies, a first flexible bridge die disposed between the first and second semiconductor dies.

20 Claims, 12 Drawing Sheets

(56) References Cited

U.S. PATENT DOCUMENTS

| | | | | |
|---|---|---|---|---|
| 6,014,313 | A * | 1/2000 | Hesselbom | H01L 25/0652 174/16.3 |
| 6,027,958 | A * | 2/2000 | Vu | H01L 21/568 257/679 |
| 6,091,138 | A * | 7/2000 | Yu | H01L 25/0652 257/686 |
| 6,486,549 | B1 * | 11/2002 | Chiang | H01L 25/0652 257/687 |
| 7,498,674 | B2 * | 3/2009 | Meyer-Berg | H01L 24/06 257/723 |
| 8,227,904 | B2 * | 7/2012 | Braunisch | H01L 25/0657 257/686 |
| 8,680,684 | B2 * | 3/2014 | Haba | H01L 25/0655 257/774 |
| 8,742,576 | B2 * | 6/2014 | Thacker | H01L 24/91 257/738 |
| 9,269,657 | B2 * | 2/2016 | Kim | H01L 23/49811 |
| 9,613,942 | B2 * | 4/2017 | Lee | H01L 25/0652 |
| 10,079,220 | B2 * | 9/2018 | Hu | H01L 23/5389 |
| 10,217,720 | B2 * | 2/2019 | Wang | H01L 25/50 |
| 2020/0176384 | A1 * | 6/2020 | Wu | H01L 21/4857 |
| 2020/0212006 | A1 * | 7/2020 | Chang | H01L 25/50 |

* cited by examiner

STACK PACKAGES RELATING TO BRIDGE DIE

CROSS-REFERENCE TO RELATED APPLICATIONS

The present application claims priority under 35 U.S.C 119(a) to Korean Application No. 10-2018-0154770, filed on Dec. 4, 2018, which is incorporated herein by references in its entirety.

BACKGROUND

1. Technical Field

The present disclosure generally relates to semiconductor package technologies and, more particularly, to stack packages relating to a bridge die.

2. Related Art

Recently, an internet of thing (IoT) technique has been widely utilized in various electronic systems. Accordingly, flexible packages have been required to realize electronic products or wearable devices utilizing the IoT technique. The flexible packages have been developed to provide semiconductor packages which are capable of bending or warping. In particular, flexible packages having a large storage capacity have been required to realize high performance electronic products or high performance wearable devices. Thus, a lot of effort may be focused on developing flexible packages that include a plurality of semiconductor dies to realize the high performance electronic products or high performance wearable devices.

SUMMARY

According to an embodiment, a stack package includes a first flexible substrate and a second flexible substrate which are vertically spaced apart from each other, a first sub-package disposed between the first and second flexible substrates, a second sub-package disposed between the first sub-package and the second flexible substrate, inner connectors electrically connecting the first sub-package to the second sub-package, and an outer polymeric encapsulating layer filling a space between the first and second flexible substrates to encapsulate the first and second sub-packages. The first sub-package includes first and second semiconductor dies disposed on the first flexible substrate to be spaced apart from each other, a first flexible bridge die disposed between the first and second semiconductor dies, a first inner polymeric encapsulating layer encapsulating the first and second semiconductor dies and the first flexible bridge die, first redistributed lines electrically connecting the first semiconductor die to the first flexible bridge die, and second redistributed lines electrically connecting the second semiconductor die to the first flexible bridge die. The inner connectors electrically connect the first flexible bridge die to the second sub-package.

According to an embodiment, a stack package includes a first sub-package, a second sub-package stacked on the first sub-package, inner connectors electrically connecting the first sub-package to the second sub-package, and an outer polymeric encapsulating layer encapsulating the first and second sub-packages. The first sub-package includes first and second semiconductor dies disposed to be spaced apart from each other, a first flexible bridge die disposed between the first and second semiconductor dies, a first inner polymeric encapsulating layer encapsulating the first and second semiconductor dies and the first flexible bridge die, first redistributed lines electrically connecting the first semiconductor die to the first flexible bridge die, and second redistributed lines electrically connecting the second semiconductor die to the first flexible bridge die. The inner connectors electrically connect the first flexible bridge die to the second sub-package.

According to an embodiment, a stack package includes a first sub-package including first and second semiconductor dies spaced apart from each other by a first flexible bride die disposed between the first and second semiconductor dies, first redistributed lines electrically connecting the first semiconductor die to the first flexible bridge die, and second redistributed line electrically connecting the second semiconductor die to the first flexible bridge die. The stack package includes first supporters attached to both edges of the first sub-package.

DETAILED DESCRIPTION

Figure 1:
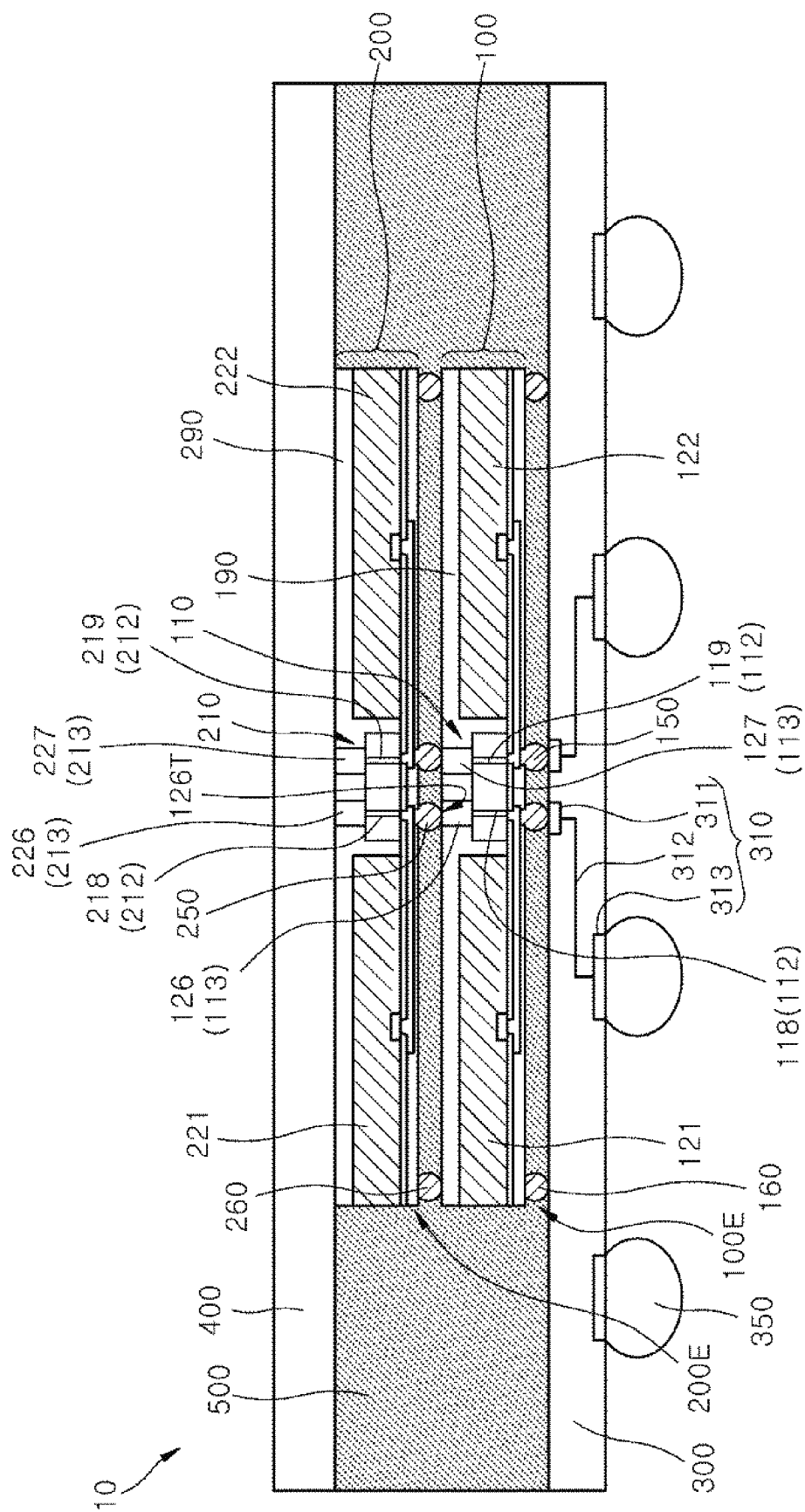
FIG. 1 is a cross-sectional view illustrating a stack package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. The term "flexible bridge die" or "flexible stack package" means a bridge die or a stack package that warps or bends without any cracks when an external force (or an external stress) is applied to the bridge die or the stack package.

In the following embodiments, a stack package may correspond to a semiconductor package. The semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a cross-sectional view illustrating a stack package 10 according to an embodiment.

Referring to FIG. 1, the stack package 10 may be configured to include a first sub-package 100 and a second sub-package 200. The second sub-package 200 may be vertically stacked on the first sub-package 100. The first and second sub-packages 100 and 200 may constitute one package module or one package unit which is included in the stack package 10. In an embodiment, the first and second sub-packages 100 and 200 may have substantially the same shape and size.

The first and second sub-packages 100 and 200 may have flexibility. That is, the first and second sub-packages 100 and 200 may be flexible sub-packages. Since the first and second sub-packages 100 and 200 have the flexibility, the first and second sub-packages 100 and 200 may easily warp or get straightened when an external force or an external stress is applied to or removed from the first and second sub-packages 100 and 200. The first and second sub-packages 100 and 200 may warp and be straightened without any cracks.

The stack structure of the first and second sub-packages 100 and 200 may be mounted on a first flexible substrate 300. A second flexible substrate 400 may be disposed to be spaced apart from the first flexible substrate 300. The stack structure of the first and second sub-packages 100 and 200 may be disposed between the first and second flexible substrates 300 and 400. The first flexible substrate 300 may include a polymer layer having a flexible property, that is, flexibility. The polymer layer included in the first flexible substrate 300 may be comprised of a polyimide material. The second flexible substrate 400 may also include a polyimide material having a flexible property.

The first flexible substrate 300 may include a substrate interconnection structure 310 for electrically connecting the first and second sub-packages 100 and 200 to an external device or an external system. Although the first flexible substrate 300 includes the substrate interconnection structure 310, the first flexible substrate 300 may still have a flexible property due to the flexibility of the polyimide layer included in the first flexible substrate 300.

The substrate interconnection structure 310 may include first conductive lands 311, second conductive lands 313, and interconnection lines 312 connecting the first conductive lands 311 to second conductive lands 313. Outer connectors 350 may be electrically connected to the second conductive lands 313. The outer connectors 350 may be disposed to electrically connect the stack package 10 to an external device or another electronic module. The outer connectors 350 may be solder balls.

First inner connectors 150 may be disposed between the first sub-package 100 and the first flexible substrate 300 to electrically connect the first sub-package 100 to the first flexible substrate 300. Second inner connectors 250 may be disposed between the first sub-package 100 and the second sub-package 200 to electrically connect the first sub-package 100 to the second sub-package 200. The first and second inner connectors 150 and 250 may be micro solder balls or conductive bumps.

An outer polymeric encapsulating layer 500 may be disposed to fill a space between the first and second flexible substrates 300 and 400. The outer polymeric encapsulating layer 500 may encapsulate the first sub-package 100 and the second sub-package 200. The outer polymeric encapsulating layer 500 may extend to fill a space between the first and second sub-packages 100 and 200.

The outer polymeric encapsulating layer 500 may further extend to fill a space between the first sub-package 100 and the first flexible substrate 300.

The outer polymeric encapsulating layer 500 may include a polymer layer having a flexible property. The outer polymeric encapsulating layer 500 may include a silicone resin material. The silicone resin material may have a resin phase corresponding to a three-dimensional network comprised of siloxane bonds (Si—O bonds).

Since all of the first and second flexible substrates 300 and 400, the outer polymeric encapsulating layer 500, and the first and second sub-packages 100 and 200 have flexibility, the stack package 10 may also have a flexible property. Thus, the stack package 10 may correspond to a flexible package which is capable of bending or warping without forming any cracks.

Figure 2:
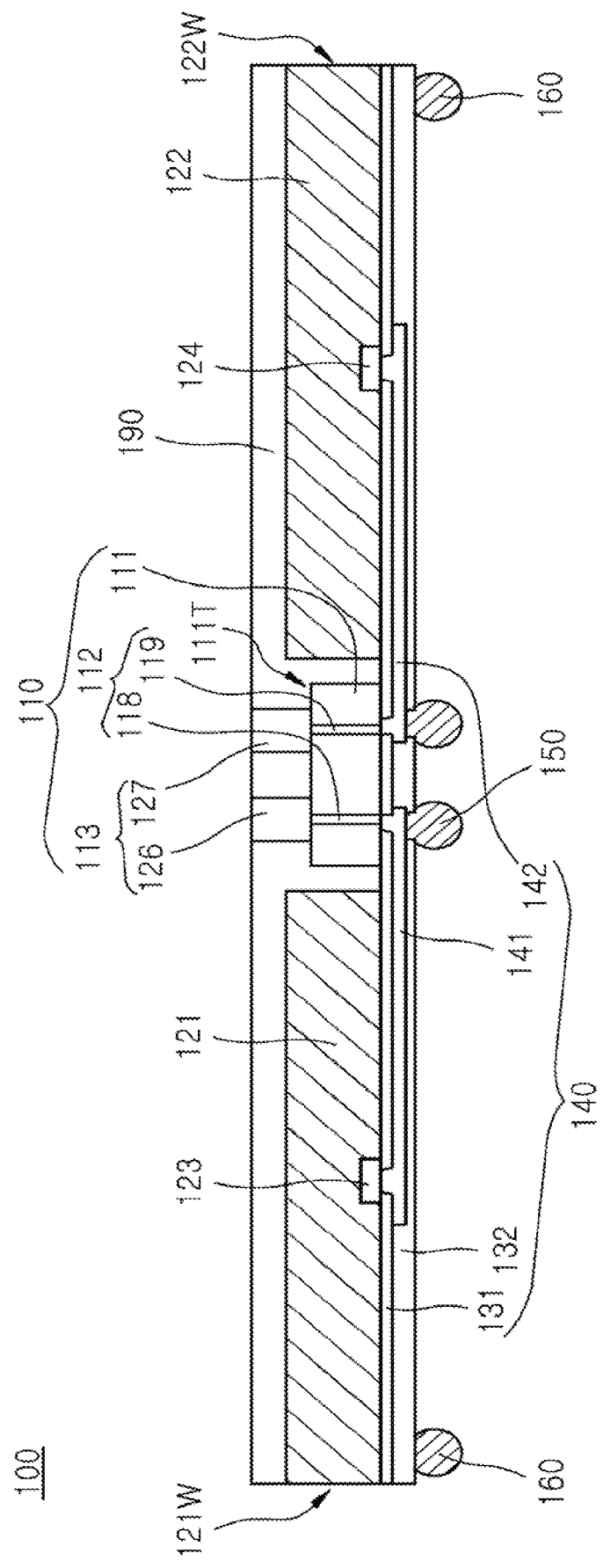
FIG. 2 is a cross-sectional view illustrating a first sub-package of the stack package shown in FIG. 1.
Figure 3:
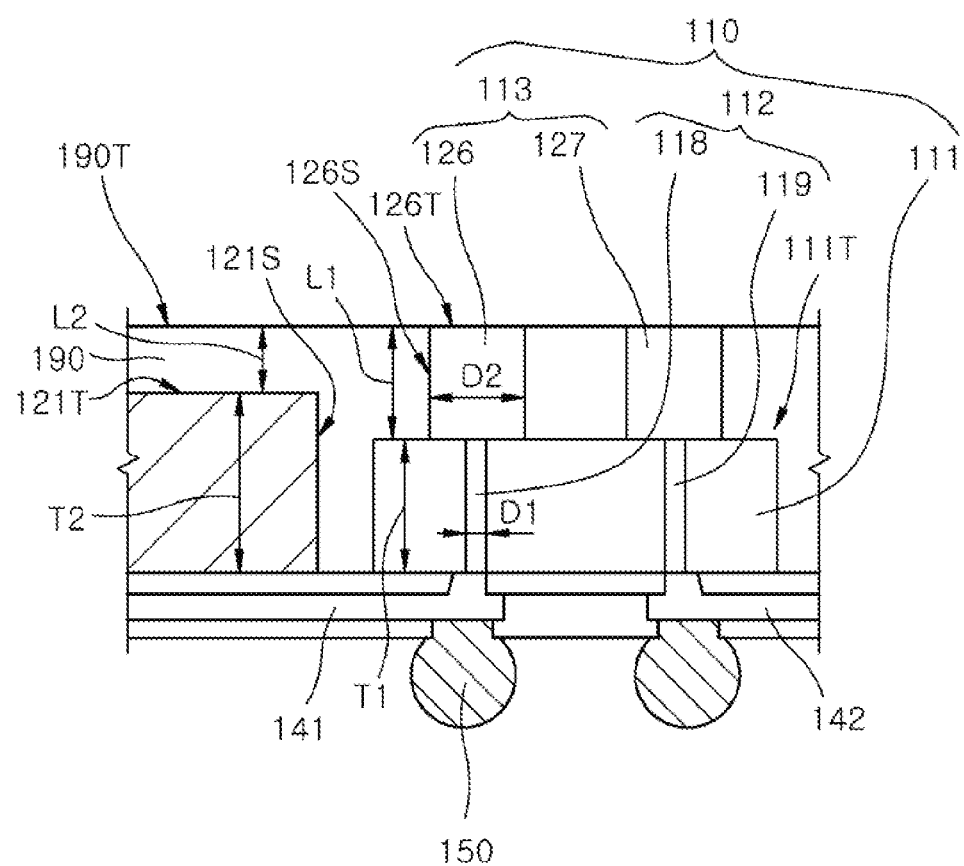
FIG. 3 is an enlarged cross-sectional view illustrating a first flexible bridge die included in the first sub-package of FIG. 2.

FIG. 2 is a cross-sectional view illustrating the first sub-package 100 included in the stack package 10 shown in FIG. 1. FIG. 3 is an enlarged cross-sectional view illustrating a first flexible bridge die 110 included in the first sub-package 100 of FIG. 2.

Referring to FIG. 2, the first sub-package 100 may be one package module or one package unit included in the stack package 10. The first sub-package 100 may include a first semiconductor die 121 and a second semiconductor die 122 which are disposed to be spaced apart from each other. The first and second semiconductor dies 121 and 122 may have the same function and size. Alternatively, the first and second semiconductor dies 121 and 122 may have different functions from each other or different sizes from each other.

The first flexible bridge die 110 may be disposed between the first semiconductor die 121 and the second semiconductor die 122. A first inner polymeric encapsulating layer 190 may cover the first and second semiconductor dies 121 and 122 and the first flexible bridge die 110 to encapsulate the first and second semiconductor dies 121 and 122 and the first flexible bridge die 110. The first inner polymeric encapsulating layer 190 may extend to fill a space between the first semiconductor die 121 and the first flexible bridge die 110. The first inner polymeric encapsulating layer 190 may be disposed to expose an outer side surface 121W of the first semiconductor die 121. The first inner polymeric encapsulating layer 190 may extend to fill a space between the second semiconductor die 122 and the first flexible bridge die 110. The first inner polymeric encapsulating layer 190 may be disposed to expose an outer side surface 122W of the second semiconductor die 122.

The first inner polymeric encapsulating layer 190 may include a polymer layer having a flexible property. Thus, the first inner polymeric encapsulating layer 190 may allow the first sub-package 100 to warp or bend. The first inner polymeric encapsulating layer 190 may include substantially the same polymer material as the outer polymeric encapsulating layer 500. The first inner polymeric encapsulating layer 190 may include a silicone resin material.

Referring to FIGS. 2 and 3, the first flexible bridge die 110 may be configured to include a first flexible bridge die body 111, through vias 112 and post bumps 113. The first inner polymeric encapsulating layer 190 may encapsulate the first and second semiconductor dies 121 and 122 and the first flexible bridge die body 111.

The first flexible bridge die body 111 may be disposed to be spaced apart from the first and second semiconductor dies 121 and 122. The through vias 112 may be disposed to vertically penetrate the first flexible bridge die body 111. The post bumps 113 may be directly connected to the through vias 112, respectively. In an embodiment, the post bumps 113 may be directly connected to the through vias 112 in a one-to-one manner whereby a single post bump 113 is connected to a single through via 112. First post bumps 126 included in the post bumps 113 may be connected to first ends of first through vias 118 included in the through vias 112, respectively. In an embodiment, the first post bumps 126 may be connected to the first ends of first through vias 118 in a one-to-one manner whereby a single first post bump 126 is connected to a single first end of a first through via 118. Second post bumps 127 included in the post bumps 113 may be connected to first ends of second through vias 119 included in the through vias 112, respectively. In an embodiment, the second post bumps 127 may be connected to the first ends of second through vias 119 in a one-to-one manner whereby a single second post bump 127 is connected to a single first end of a second through via 119. The first and second post bumps 126 and 127 may be disposed to protrude from a top surface 111T of the first flexible bridge die body 111.

Referring to FIG. 3, the first flexible bridge die body 111 may have a thickness T1 which is less than a thickness T2 of the first semiconductor die 121. A distance L1 between a top surface 190T of the first inner polymeric encapsulating layer 190 and the top surface 111T of the first flexible bridge die body 111 may be greater than a distance L2 between the top surface 190T of the first inner polymeric encapsulating layer 190 and a top surface 121T of the first semiconductor die 121. The thickness T1 of the first flexible bridge die body 111 may correspond to 40% to 90% of the thickness T2 of the first semiconductor die 121. The thickness T1 of the first flexible bridge die body 111 may be approximately half the thickness T2 of the first semiconductor die 121.

The first flexible bridge die body 111 may include a polymer layer having a flexible property. The first flexible bridge die body 111 may include a polyimide layer having a flexible property as well as an excellent electric insulation property. In such a case, the through vias 112 may vertically penetrate the polyimide layer. The through vias 112 may have a shape and a structure that are similar to through silicon vias (TSVs). For example, the through vias 112 may be fabricated by forming through holes penetrating the polyimide layer and by forming conductive vias filling the through holes. In such a case, the conductive vias may be formed of a metal layer including a conductive metal material, for example, a copper material.

The through vias 112 may be formed to have a diameter D1 corresponding to a fine pitch array of the through vias 112. Since the thickness T1 of the first flexible bridge die body 111 is less than the thickness T2 of the first semiconductor die 121, the through vias 112 vertically penetrating the first flexible bridge die body 111 may have a relatively short length in a vertical direction. On the contrary, if the first flexible bridge die body 111 have a thickness which is equal to or greater than the thickness T2 of the first semiconductor die 121, the through vias vertically penetrating the first flexible bridge die body 111 may have a vertical length which is greater than the vertical length of the first and second through vias 118 and 119 when the first flexible bridge die body 111 have a thickness which is less than the thickness T2 of the first semiconductor die 121.

In order that the through vias 112 have an increased length with a reduced diameter, it may be necessary to increase an aspect ratio of through holes to be filled with the through vias 112. However, there may be some limitations in increasing the aspect ratio of the through holes due to a difficulty of a process for forming the through holes. In other word, if a thickness of the first flexible bridge die body 111 increases, a length of the through holes penetrating the first flexible bridge die body 111 may increase and a diameter of the through holes may also increase. That is, it may be difficult to form the through holes with an increased length while having a reduced diameter or maintaining the diameter of the through hole. According to a present embodiment, since the first flexible bridge die body 111 has a relatively reduced thickness (i.e., the thickness T1) as compared with the first semiconductor die 121, the through holes to be filled with the through vias 112 may have a reduced vertical length. Thus, the through vias 112 may be formed to have the fine diameter D1. As a result, it may be possible to increase the number of the through vias 112 formed in a limited area.

Referring to FIG. 3, the first post bumps 126 may be electrically connected to top ends of the first through vias 118, respectively. In an embodiment, the first post bumps 126 may be electrically connected to top ends of the first through vias 118 in a one-to-one manner whereby a single first post bump 126 is electrically connected to a top end of a single first through via 118. The first post bumps 126 may be disposed to overlap with respective ones of the first through vias 118 in a plan view. In an embodiment, the first post bumps 126 may be disposed to overlap with the first through vias 118 in a plan view with a one-to-one manner whereby a single first post bump 126 overlaps with a single first though via 118. The second post bumps 127 may be electrically connected to top ends of the second through vias 119, respectively. In an embodiment, the second post bumps 127 may be electrically connected to top ends of the second through vias 119 in a one-to-one manner whereby a single second post bump 127 is electrically connected to a top end of a single second through via 119. The second post bumps 127 may also be disposed to overlap with respective ones of the second through vias 119 in a plan view. In an embodiment, the second post bumps 127 may also be disposed to overlap with the second through vias 119 in a plan view with a one-to-one manner whereby a single second post bump 127 overlaps with a single second through via 119. The first post bumps 126 may protrude from the top surface 111T of the first flexible bridge die body 111 such that first side surfaces 126S of the first post bumps 126 face an inner side surface 121S of the first semiconductor die 121.

The first inner polymeric encapsulating layer 190 may be disposed to cover the top surface 111T of the first flexible bridge die body 111 and to surround side surfaces of the first post bumps 126. The first inner polymeric encapsulating layer 190 may be disposed to directly cover the side surfaces of the first post bumps 126 and to reveal top surfaces 126T of the first post bumps 126.

The first post bumps 126 may extend electrical paths of the first through vias 118 to the top surface 190T of the first inner polymeric encapsulating layer 190. As illustrated in FIG. 1, the second inner connectors 250 may be bonded to the top surfaces of the first and second post bumps 126 and 127, which are revealed by the first inner polymeric encapsulating layer 190. The second inner connectors 250 may electrically connect the first and second post bumps 126 and 127 to the second sub-package 200.

Referring to FIG. 3, the plurality of through vias 112 may be disposed in a limited region of the first flexible bridge die body 111. If a distance between the through vias 112 is reduced, signals transmitted through the through vias 112 may include noises such as crosstalk. The noises may affect a signal transmission characteristic or a signal integrity of the signals transmitted through the through vias 112 if the signals correspond to high frequency signals.

Since the first flexible bridge die body 111 having the thickness T1 is relatively thin, the diameter D1 of the through vias 112 may have a relatively small value as compared a diameter D2 of the post bumps 113. A distance between the through vias 112 connected to respective ones of the post bumps 113 may be greater than a distance between the post bumps 113. Accordingly, a signal noise between the first through vias 118 and the second through vias 119 may be effectively suppressed or mitigated.

The post bumps 113 may be metal posts including a copper material. The post bumps 113 may have a height (or a vertical length) of approximately 60 micrometers. The diameter D2 of the post bumps 113 may be within the range of approximately 20 micrometers to approximately 30 micrometers. In contrast, the diameter D1 of the through vias 112 may be approximately 0.5 micrometers. Since the diameter D2 of the post bumps 113 is greater than the diameter D1 of the through vias 112, it may be possible to directly bond the second inner connectors (250 of FIG. 1) to the top surfaces of the post bumps 113. That is, no additional conductive pads are required to electrically connect the second inner connectors (250 of FIG. 1) to the top surfaces of the post bumps 113.

Referring again to FIG. 2, the first semiconductor die 121 may be disposed on first redistributed lines 141. The second semiconductor die 122 may be disposed on second redistributed lines 142. The first and second redistributed lines 141 and 142 may be conductive patterns including an aluminum material, a copper material or a gold material. The first redistributed lines 141 may extend to electrically connect the first semiconductor die 121 to the first flexible bridge die 110. The second redistributed lines 142 may extend to electrically connect the second semiconductor die 122 to the first flexible bridge die 110.

The first semiconductor die 121 may be disposed on the first redistributed lines 141 in a flip chip form such that first contact pads 123 of the first semiconductor die 121 face the first redistributed lines 141. The second semiconductor die 122 may be disposed on the second redistributed lines 142 in a flip chip form such that second contact pads 124 of the second semiconductor die 122 face the second redistributed lines 142. The first and second contact pads 123 and 124 may be conductive patterns that are used as paths for electrically connecting the first and second semiconductor dies 121 and 122 to an external device or an external system.

The first and second redistributed lines 141 and 142 may extend onto the first flexible bridge die body 111. First ends of the first and second redistributed lines 141 and 142 may be connected to bottom ends of the through vias 112 opposite to the post bumps 113, respectively. In an embodiment, first ends of the first and second redistributed lines 141 and 142 may be connected to bottom ends of the through vias 112 in a one-to-one manner whereby a single first end of the first or second redistributed line 141 or 142 is connected to a bottom end of a single through via 112. Second ends of the first and second redistributed lines 141 and 142 may be connected to the first and second contact pads 123 and 124, respectively. Accordingly, the first redistributed lines 141 may electrically connect the first semiconductor die 121 to the first through vias 118, and the second redistributed lines 142 may electrically connect the second semiconductor die 122 to the second through vias 119.

The first and second redistributed lines 141 and 142 may constitute a first redistributed line structure 140. The first redistributed line structure 140 may further include a first dielectric layer 131 and a second dielectric layer 132 that electrically isolate the first and second redistributed lines 141 and 142 from each other. The first dielectric layer 131 may be disposed between the first semiconductor die 121 and the first redistributed lines 141 as well as between the second semiconductor die 122 and the first redistributed lines 142 to electrically insulate a body of the first semiconductor die 121 from the first redistributed lines 141 and to electrically insulate a body of the second semiconductor die 122 from the second redistributed lines 142. The second dielectric layer 132 may cover the first and second redistributed lines 141 and 142 on a bottom surface of the first dielectric layer 131 to electrically insulate the first and second redistributed lines 141 and 142 from each other.

The first inner connectors 150 may be attached to respective ones of the first and second redistributed lines 141 and 142. In an embodiment, the first inner connectors 150 may be attached to the first and second redistributed lines 141 and 142 in a one-to-one manner whereby a single first inner connector 150 is attached to a single first or second redistributed line 141 or 142. The first inner connectors 150 may penetrate the second dielectric layer 132 and may be bonded to the first and second redistributed lines 141 and 142. The first inner connectors 150 may be located to overlap with respective ones of the first and second through vias 118 and 119 in a plan view. In an embodiment, the first inner connectors 150 may be located to overlap with the first and second through vias 118 and 119 in a one-to-one manner whereby a single first inner connector 150 is located to overlap with a single first or second through via 118 or 119.

Figure 4:
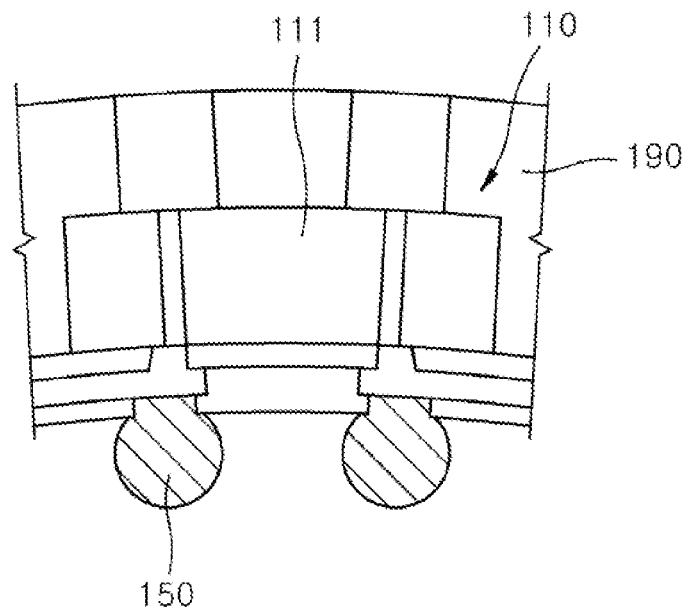
FIGS. 4 and 5 are cross-sectional views illustrating warped shapes of a first flexible bridge die included in a stack package according to an embodiment.
Figure 5:
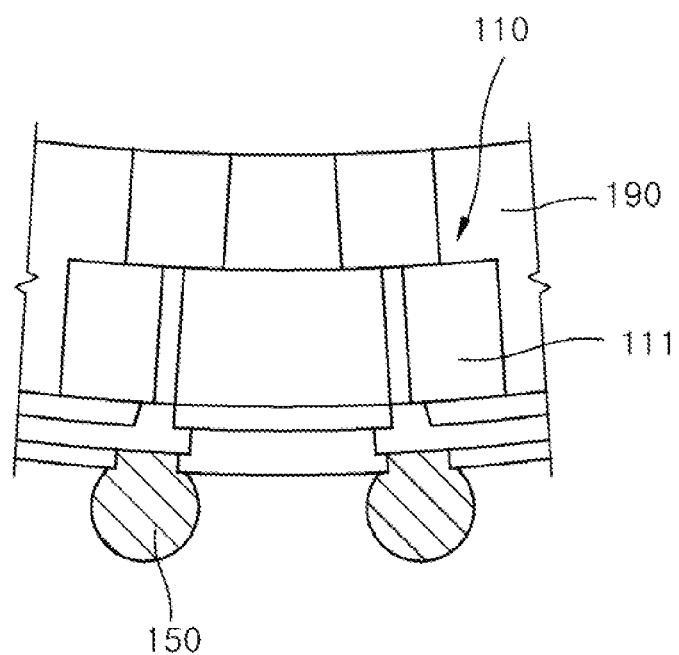

FIGS. 4 and 5 are cross-sectional views illustrating warped shapes of the first flexible bridge die 110 included in the stack package 10 of FIG. 1.

Referring to FIGS. 4 and 5, since the first flexible bridge die body 111 has a flexible property, the first flexible bridge die 110 may warp if an external force is applied to the first flexible bridge die 110. The first inner polymeric encapsulating layer 190 covering the first flexible bridge die 110 may also have a flexible property. Thus, the first inner polymeric encapsulating layer 190 as well as the first flexible bridge die 110 may also warp if an external force is applied to the first inner polymeric encapsulating layer 190. As illustrated in FIG. 4, both edges of the first flexible bridge die 110 may move downward such that the first flexible bridge die 110 warps in a crying shape. In an embodiment, as illustrated in FIG. 4, both edges of the first flexible bridge die 110 may move downwardly such that the first flexible bridge die 110 warps to form a concave shape towards the redistribution line structure side of the sub package and a convex shape towards the top surface of first inner polymeric encapsulating layer 190 side of the sub package. In addition, as illustrated in FIG. 5, both edges of the first flexible bridge die 110 may move upward such that the first flexible bridge die 110 warps in a smile shape. In an embodiment, as illustrated in FIG. 5, both edges of the first flexible bridge die 110 may move upward such that the first flexible bridge die 110 warps to form a convex shape towards the redistribution line structure side of the sub package and a concave shape towards the top surface of first inner polymeric encapsulating layer 190 side of the sub package.

Figure 6:
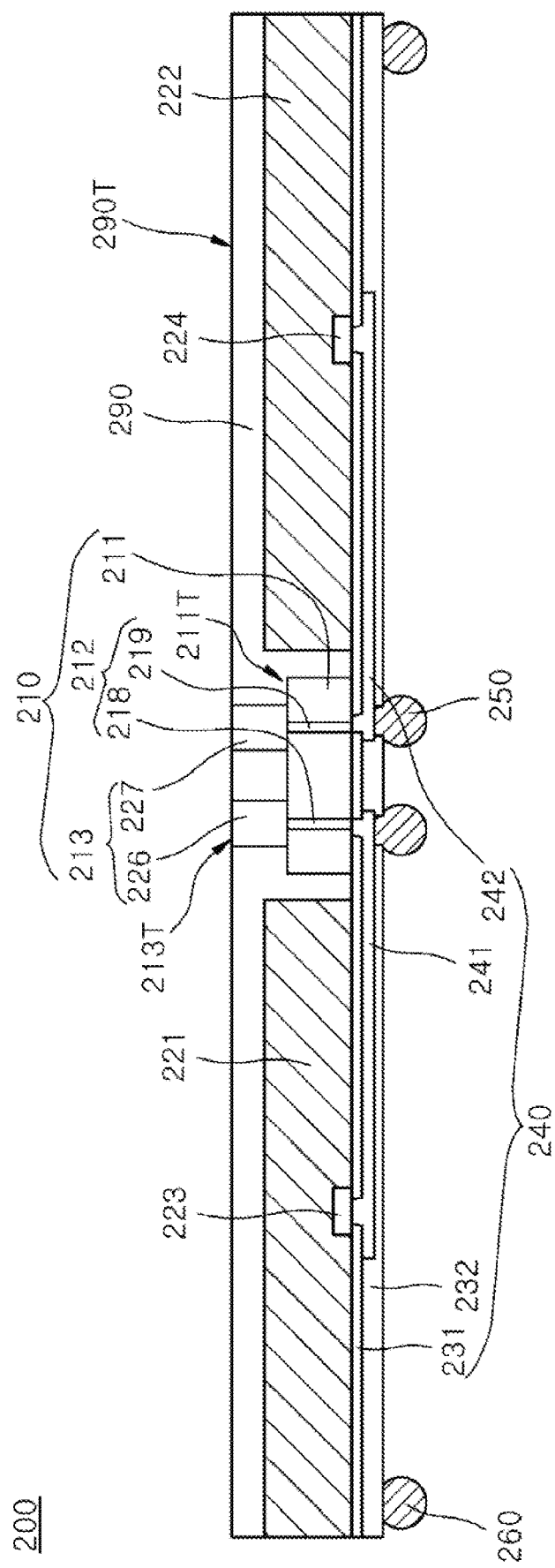
FIG. 6 is a cross-sectional view illustrating a second sub-package of the stack package shown in FIG. 1.

FIG. 6 is a cross-sectional view illustrating the second sub-package 200 of the stack package 10 shown in FIG. 1.

Referring to FIG. 6, the second sub-package 200 may be one package module or one package unit included in the stack package 10. In an embodiment, the second sub-package 200 may have substantially the same configuration and size as the first sub-package 100.

The second sub-package 200 may include a third semiconductor die 221 and a fourth semiconductor die 222 which are disposed to be spaced apart from each other. The third and fourth semiconductor dies 221 and 222 may have the same function and size. Alternatively, the third and fourth semiconductor dies 221 and 222 may have different functions from each other or different sizes from each other.

A second flexible bridge die 210 may be disposed between the third semiconductor die 221 and the fourth semiconductor die 222. A second inner polymeric encapsulating layer 290 may cover the third and fourth semiconductor dies 221 and 222 and the second flexible bridge die 210 to encapsulate the third and fourth semiconductor dies 221 and 222 and the second flexible bridge die 210. The second inner polymeric encapsulating layer 290 may extend to fill a space between the third semiconductor die 221 and the second flexible bridge die 210. The second inner polymeric encapsulating layer 290 may extend to fill a space between the fourth semiconductor die 222 and the second flexible bridge die 210. The second inner polymeric encapsulating layer 290 may include a polymer layer having a flexible property. The second inner polymeric encapsulating layer 290 may include a silicone resin material.

The second flexible bridge die 210 may be configured to include a second flexible bridge die body 211, through vias 212 and post bumps 213. The second inner polymeric encapsulating layer 290 may encapsulate the third and fourth semiconductor dies 221 and 222 and the second flexible bridge die body 211.

The second flexible bridge die body 211 may be disposed to be spaced apart from the third and fourth semiconductor dies 221 and 222. The through vias 212 may be disposed to vertically penetrate the second flexible bridge die body 211. The post bumps 213 may be directly connected to the through vias 212, respectively. In an embodiment, the post bumps 213 may be directly connected to the through vias 212 in a one-to-one manner whereby a single post bump 213 is connected to a single through via 212. Third post bumps 226 included in the post bumps 213 may be connected to first ends of third through vias 218 included in the through vias 212, respectively. In an embodiment, the third post bumps 226 may be connected to the first ends of third through vias 218 in a one-to-one manner whereby a single third post bump 226 is connected to a single first end of a third through via 218. Fourth post bumps 227 included in the post bumps 213 may be connected to first ends of fourth through vias 219 included in the through vias 212, respectively. In an embodiment, the fourth post bumps 227 may be connected to the first ends of fourth through vias 219 in a one-to-one manner whereby a single fourth post bump 227 is connected to a single first end of a fourth through via 219. The third post bumps 226 may be disposed to overlap with respective ones of the third through vias 218 in a plan view. In an embodiment, the third post bumps 226 may be disposed to overlap with the third through vias 218 in a one-to-one manner whereby a single third post bump 226 is disposed to overlap with a single third through via 218. The fourth post bumps 227 may be disposed to overlap with respective ones of the fourth through vias 219 in a plan view. In an embodiment, the fourth post bumps 227 may be disposed to overlap with the fourth through vias 219 in a one-to-one manner whereby a single fourth post bump 227 is disposed to overlap with a single fourth through via 219.

The third and fourth post bumps 226 and 227 may be disposed to protrude from a top surface 211T of the second flexible bridge die body 211. The second flexible bridge die body 211 may have a thickness which is less than a thickness of the third semiconductor die 221 adjacent to the second flexible bridge die 210. The second flexible bridge die body 211 may include a polymer layer having a flexible property. The second flexible bridge die body 211 may include a polyimide layer having a flexible property as well as an electric insulation property.

The second inner polymeric encapsulating layer 290 may be disposed to cover the top surface 211T of the second flexible bridge die body 211 and to surround side surfaces of the post bumps 213. The second inner polymeric encapsulating layer 290 may be disposed to directly cover the side surfaces of the post bumps 213 and to reveal top surfaces 213T of the post bumps 213. The third post bumps 226 may extend electrical paths of the third through vias 218 to a top surface 290T of the second inner polymeric encapsulating layer 290.

The third semiconductor die 221 may be disposed on third redistributed lines 241. The fourth semiconductor die 222 may be disposed on fourth redistributed lines 242. The third redistributed lines 241 may extend to electrically connect the third semiconductor die 221 to the second flexible bridge die 210. The fourth redistributed lines 242 may extend to electrically connect the fourth semiconductor die 222 to the second flexible bridge die 210.

The third semiconductor die 221 may be disposed on the third redistributed lines 241 in a flip chip form such that third contact pads 223 of the third semiconductor die 221 face the third redistributed lines 241. The fourth semiconductor die 222 may be disposed on the fourth redistributed lines 242 in a flip chip form such that fourth contact pads 224 of the fourth semiconductor die 222 face the fourth redistributed lines 242. First ends of the third and fourth redistributed lines 241 and 242 may be connected to bottom ends of the through vias 212 opposite to the post bumps 213, respectively. In an embodiment, first ends of the third and fourth redistributed lines 241 and 242 may be connected to bottom ends of the through vias 212 in a one-to-one manner whereby a single first end of the third or fourth redistributed line 241 or 242 is connected to a bottom end of a single through via 212. Second ends of the third and fourth redistributed lines 241 and 242 may be connected to the third and fourth contact pads 223 and 224, respectively. Accordingly, the third redistributed lines 241 may electrically connect the third semiconductor die 221 to the third through vias 218, and the fourth redistributed lines 242 may electrically connect the fourth semiconductor die 222 to the fourth through vias 219.

The third and fourth redistributed lines 241 and 242 may constitute a second redistributed line structure 240. The second redistributed line structure 240 may further include a third dielectric layer 231 and a fourth dielectric layer 232 that electrically isolate the third and fourth redistributed lines 241 and 242 from each other.

The second inner connectors 250 may be attached to respective ones of the third and fourth redistributed lines 241 and 242. In an embodiment, the second inner connectors 250 may be attached to the third and fourth redistributed lines 241 and 242 in a one-to-one manner whereby a single second inner connector 250 is attached to a single third or fourth redistributed line 241 or 242. The second inner connectors 250 may penetrate the fourth dielectric layer 232 and may be bonded to the third and fourth redistributed lines 241 and 242. The second inner connectors 250 may be located to overlap with respective ones of the third and fourth through vias 218 and 219 in a plan view. In an embodiment, the second inner connectors 250 may be located to overlap with the third and fourth through vias 218 and 219 in a one-to-one manner whereby a single second inner connector 250 is located to overlap with a single third or fourth through via 218 or 219.

Referring to FIGS. 1 and 6, the second inner connectors 250 may be disposed to electrically connect the first sub-package 100 to the second sub-package 200. The second inner connectors 250 may be disposed to electrically connect the second sub-package 200 to the first flexible bridge die 110. The first inner connectors 150 may be located to overlap with respective ones of the through vias 112 in a plan view, and the second inner connectors 250 may be located to overlap with respective ones of the through vias 212 in a plan view. In an embodiment, the first inner connectors 150 may be located to overlap with the through vias 112 in a one-to-one manner whereby a single first inner connector 150 is located to overlap with a single through via 112. In an embodiment, the second inner connectors 250 may be located to overlap with the through vias 212 in a one-to-one manner whereby a single second inner connector 250 is located to overlap with a single through via 212. In addition, the first inner connectors 150 may be located to overlap with respective ones of the second inner connectors 250 in a plan view. In an embodiment, the first inner connectors 150 may be located to overlap with the second inner connectors 250 in a one-to-one manner whereby a single first inner connector 150 is located to overlap with a single second inner connector 250.

As the second sub-package 200 is stacked on the first sub-package 100, the second flexible bridge die 210 may be located to overlap with the first flexible bridge die 110 in a plan view. Thus, the third post bumps 226, the third through vias 218, some of the second inner connectors 250, the first post bumps 126, the first through vias 118 and some of the first inner connectors 150 may be located to overlap with each other in a plan view. Similarly, the fourth post bumps 227, the fourth through vias 219, the other ones of the second inner connectors 250, the second post bumps 127, the second through vias 119 and the other ones of the first inner connectors 150 may be located to overlap with each other in a plan view.

Referring again to FIG. 1, the first flexible bridge die 110 may be fixed to the first flexible substrate 300 using the first inner connectors 150, and the second flexible bridge die 210 may be fixed to the first flexible bridge die 110 using the second inner connectors 250. The first sub-package 100 may be fixed to the first flexible substrate 300 using the first inner connectors 150, and the second sub-package 200 may be fixed to the first sub-package 100 using the second inner connectors 250.

The first and second semiconductor dies 121 and 122 disposed at both sides of the first flexible bridge die 110 may be flexible to warp because the first and second semiconductor dies 121 and 122 are not fixed to the first flexible substrate 300. Since the first inner polymeric encapsulating layer 190 covering the first and second semiconductor dies 121 and 122 has a flexible property, a portion including the first and second semiconductor dies 121 and 122 may be flexible to warp. That is, local regions of the first sub-package 100 including the first and second semiconductor dies 121 and 122 might not be fixed to the first flexible substrate 300 to be flexible.

First supporters 160 supporting local regions of the first sub-package 100 may be attached to the first sub-package 100 such that the local regions of the first sub-package 100 are spaced apart from the first flexible substrate 300. The first supporters 160 may be disposed between the first sub-package 100 and the first flexible substrate 300. The first supporters 160 may be attached to both edges 100E of the first sub-package 100. The first supporters 160 are not bonded or fixed to the first flexible substrate 300 but in just contact with the first flexible substrate 300. Accordingly, the first supporters 160 may be movable on a surface of the first flexible substrate 300. In an embodiment, the first supporters 160 may be attached to both edges 100E of the first sub-package 100 and may be in movable contact with the first flexible substrate 300 because the first supporters 160 are not boned or fixed to the first flexible substrate 300 and are merely in contact with the first flexible substrate 300.

Second supporters 260 supporting local regions of the second sub-package 200 may be attached to the second sub-package 200 such that the local regions of the second sub-package 200 are spaced apart from the first sub-package 100. The second supporters 260 may be disposed between the first sub-package 100 and the second sub-package 200. The second supporters 260 may be attached to both edges 200E of the second sub-package 200. The first and second supporters 160 and 260 may be polymeric balls having an elastic property for alleviating an impact or a shock applied to the first and second supporters 160 and 260. In an embodiment, the second supporters 260 may be attached to both edges 200E of the second sub-package 200 and may be in movable contact with the first sub-package 100 because the second supporters 260 are not boned or fixed to the first sub-package 100 and are merely in contact with the first sub-package 100.

Figure 7:
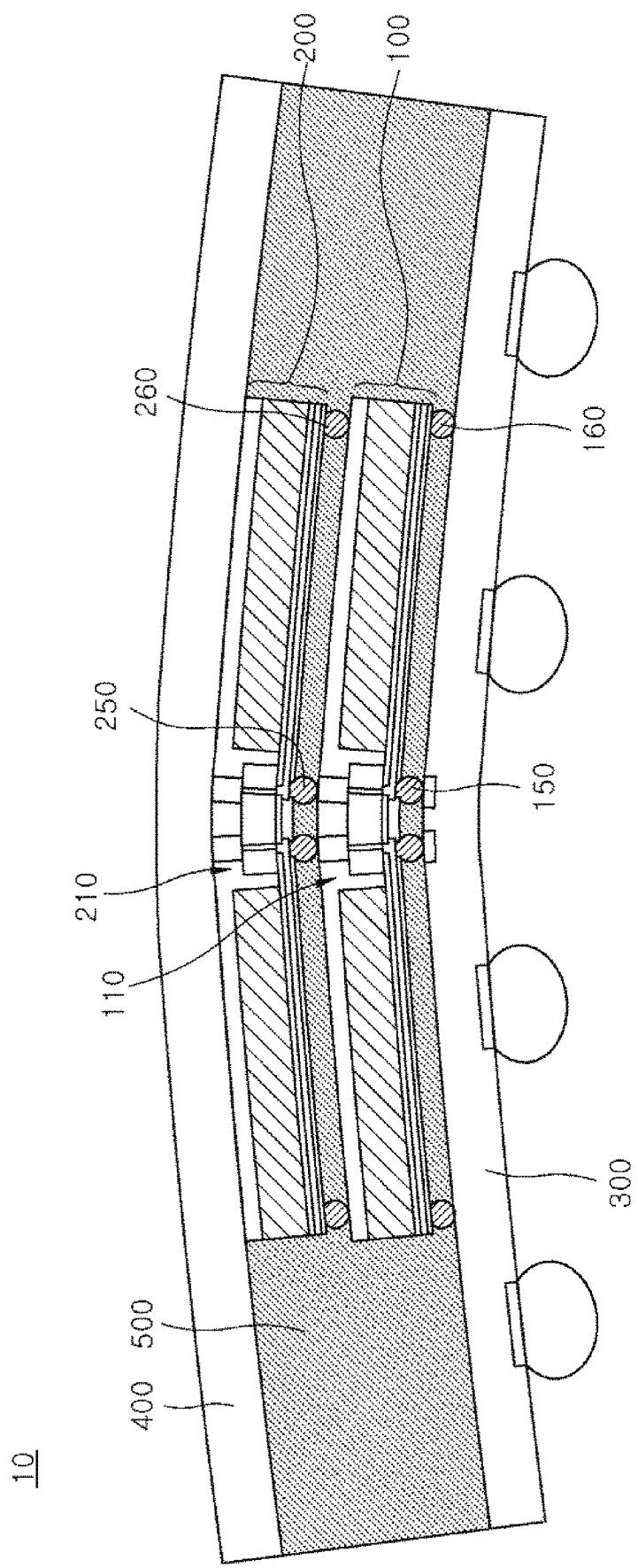
FIGS. 7 and 8 are cross-sectional views illustrating warped shapes of the stack package shown in FIG. 1.
Figure 8:
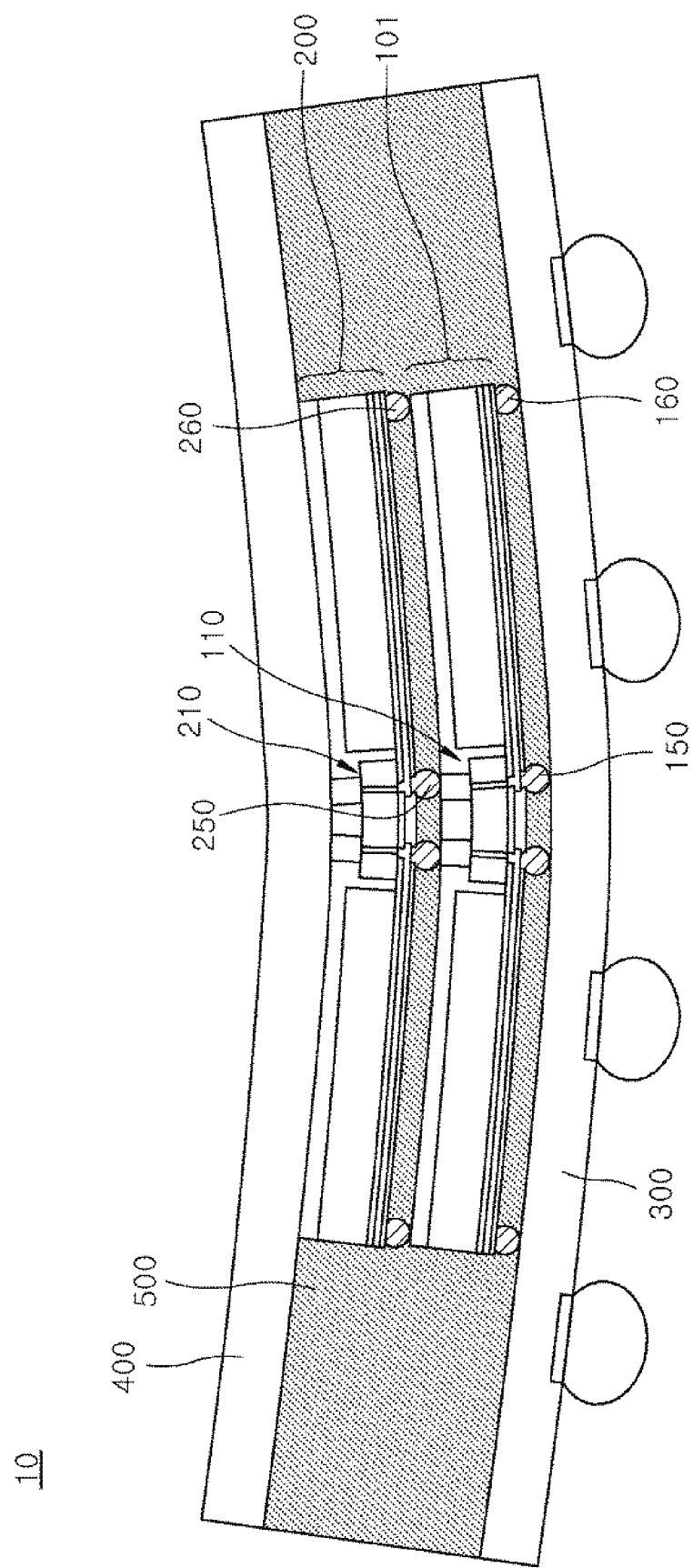

FIGS. 7 and 8 are cross-sectional views illustrating warped shapes of the stack package 10 shown in FIG. 1.

Referring to FIGS. 7 and 8, since all of the first and second flexible substrates 300 and 400, the outer polymeric encapsulating layer 500, and the first and second sub-packages 100 and 200 are flexible, the stack package 10 may warp or bend without generation of cracks when an external force is applied to the stack package 10. As illustrated in FIG. 7, both edges of the stack package 10 may move downward such that the stack package 10 warps in a crying shape. In an embodiment, as illustrated in FIG. 7, both edges of the stack package 10 may move downward such that the stack package 10 warps to form a concave shape towards the first flexible substrate 300 and a convex shape towards the second flexible substrate 400. In addition, as illustrated in FIG. 8, both edges of the stack package 10 may move upward such that the stack package 10 warps in a smile shape. In an embodiment, as illustrated in FIG. 8, both edges of the stack package 10 may move upward such that the stack package 10 warps to form a convex shape towards the first flexible substrate 300 and a concave shape towards the second flexible substrate 400.

Figure 9:
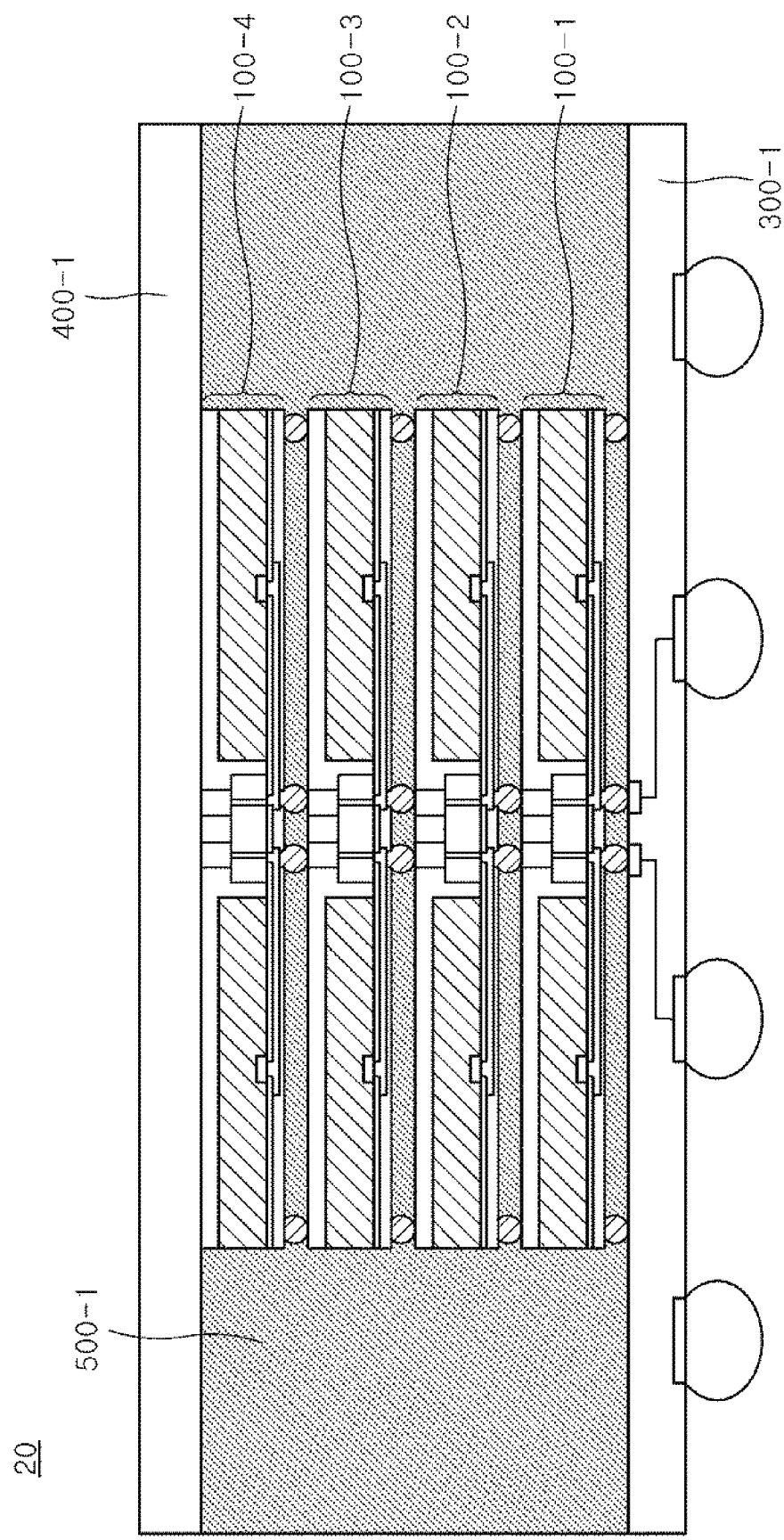
FIG. 9 is a cross-sectional view illustrating a stack package according to another embodiment.

FIG. 9 is a cross-sectional view illustrating a stack package 20 according to another embodiment.

Referring to FIG. 9, the stack package 20 may be configured to include first and second flexible substrates 300-1 and 400-1 vertically spaced apart from each other and first to fourth sub-packages 100-1, 100-2, 100-3 and 100-4 vertically stacked. The first to fourth sub-packages 100-1, 100-2, 100-3 and 100-4 may be disposed between the first and second flexible substrates 300-1 and 400-1. An outer polymeric encapsulating layer 500-1 may fill a space between the first and second flexible substrates 300-1 and 400-1 to encapsulate the first to fourth sub-packages 100-1, 100-2, 100-3 and 100-4.

Each of the first to fourth sub-packages 100-1, 100-2, 100-3 and 100-4 may have the same configuration as the first sub-package 100 illustrated in FIG. 2 or the second sub-package 200 illustrated in FIG. 6. The first to fourth sub-packages 100-1, 100-2, 100-3 and 100-4 may be vertically stacked like the first and second sub-packages 100 and 200 vertically stacked in FIG. 1.

The stack package 20 having the aforementioned configurations may have a flexible property to allow the stack package 20 to warp without generation of cracks. Although FIG. 9 illustrates an example in which the stack package 20 includes four sub-packages, the number of the sub-packages included in the stack package 20 may be set to be different according to the embodiments.

Figure 10:
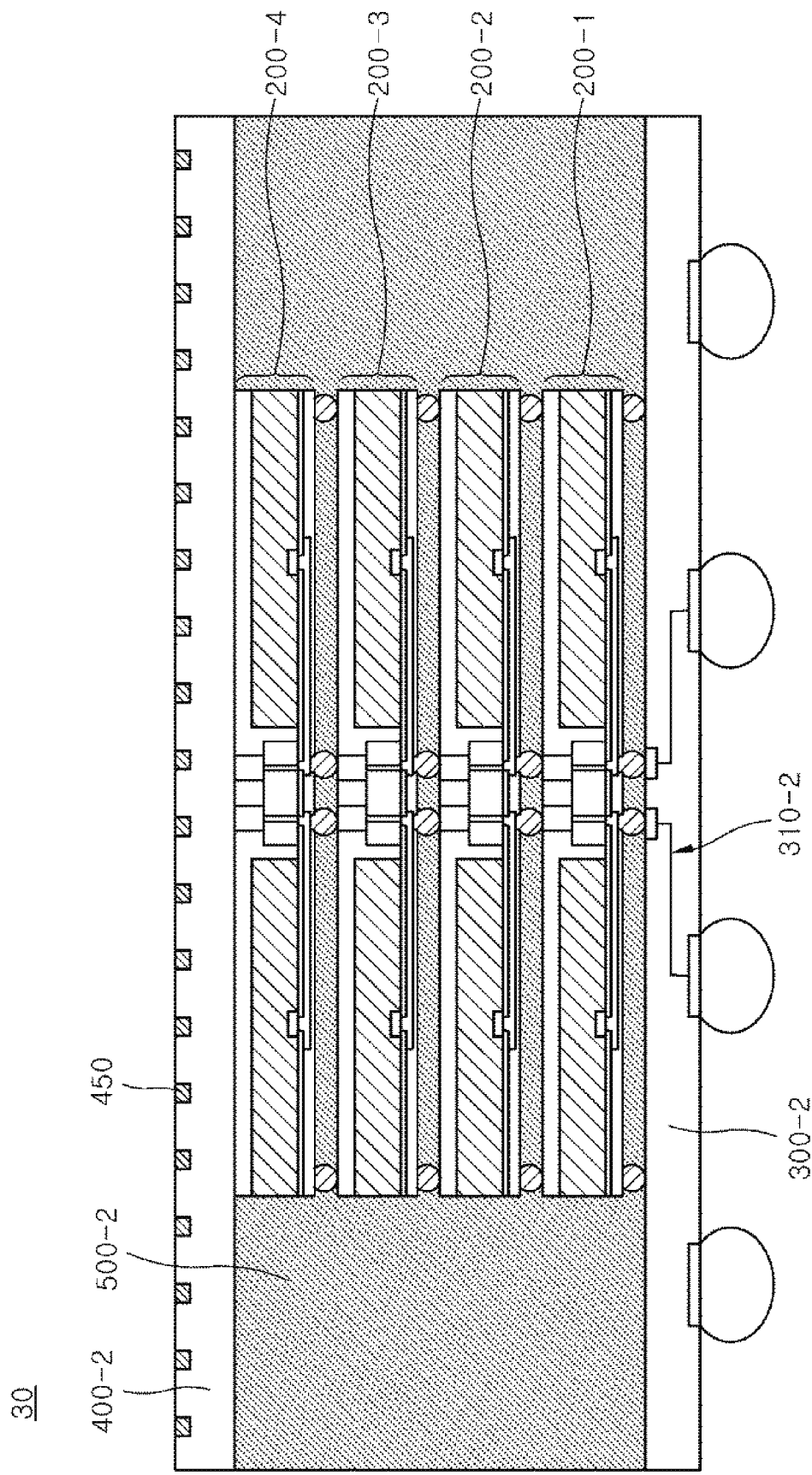
FIG. 10 is a cross-sectional view illustrating a stack package according to yet another embodiment.
Figure 11:
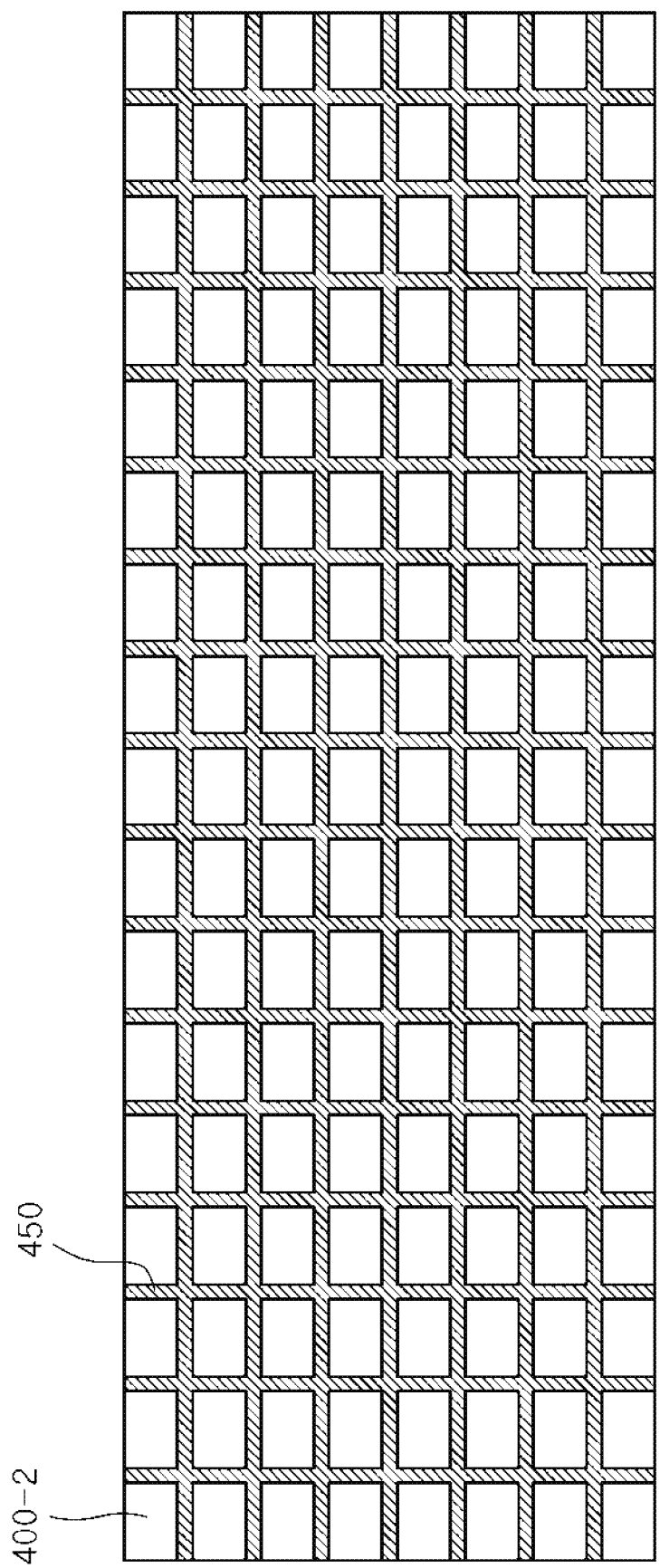
FIG. 11 is a plan view illustrating a reinforcement pattern of the stack package shown in FIG. 10.

FIG. 10 is a cross-sectional view illustrating a stack package 30 according to yet another embodiment. FIG. 11 is a plan view illustrating a reinforcement pattern 450 of the stack package 30 shown in FIG. 10.

Referring to FIGS. 10 and 11, the stack package 30 may be configured to include first and second flexible substrates 300-2 and 400-2 vertically spaced apart from each other and first to fourth sub-packages 200-1, 200-2, 200-3 and 200-4 vertically stacked. The first to fourth sub-packages 200-1, 200-2, 200-3 and 200-4 may be disposed between the first and second flexible substrates 300-2 and 400-2. An outer polymeric encapsulating layer 500-2 may fill a space between the first and second flexible substrates 300-2 and 400-2 to encapsulate the first to fourth sub-packages 200-1, 200-2, 200-3 and 200-4.

Each of the first to fourth sub-packages 200-1, 200-2, 200-3 and 200-4 may have the same configuration as the first sub-package 100 illustrated in FIG. 2 or the second sub-package 200 illustrated in FIG. 6. The first to fourth sub-packages 200-1, 200-2, 200-3 and 200-4 may be vertically stacked like the first and second sub-packages 100 and 200 vertically stacked in FIG. 1.

The stack package 30 having the aforementioned configurations may have a flexible property to allow the stack package 30 to warp without generation of cracks.

The reinforcement pattern 450 may be included in the second flexible substrate 400-2 to reinforce the stiffness or modulus of elasticity of the second flexible substrate 400-2. If the second flexible substrate 400-2 includes a body comprised of a polyimide layer without the reinforcement pattern 450 while the first flexible substrate 300-2 includes an interconnection structure 310-2 in addition to a body comprised of a polyimide layer, the stiffness or modulus of elasticity of the second flexible substrate 400-2 may be less than the stiffness or modulus of elasticity of the first flexible substrate 300-2. Thus, the reinforcement pattern 450 may be disposed in the second flexible substrate 400-2 to balance the stiffness or modulus of elasticity of the first and second flexible substrates 300-2 and 400-2. That is, the stiffness or modulus of elasticity of the first flexible substrate 300-2 may be similar or substantially equal to the stiffness or modulus of elasticity of the second flexible substrate 400-2 including the reinforcement pattern 450. Accordingly, the reinforcement pattern 450 may prevent the stack package 30 from undesirably warping or bending when no external force is applied to the stack package 30. In an embodiment, the reinforcement pattern 450 may include a metal layer.

The reinforcement pattern 450 may be disposed to be adjacent to a surface of the second flexible substrate 400-2 and may be disposed to have a mesh shape in a plan view, as illustrated in FIG. 11. The reinforcement pattern 450 may be embedded in the second flexible substrate 400-2 and may be adjacent to a surface of the second flexible substrate 400-2.

Figure 12:
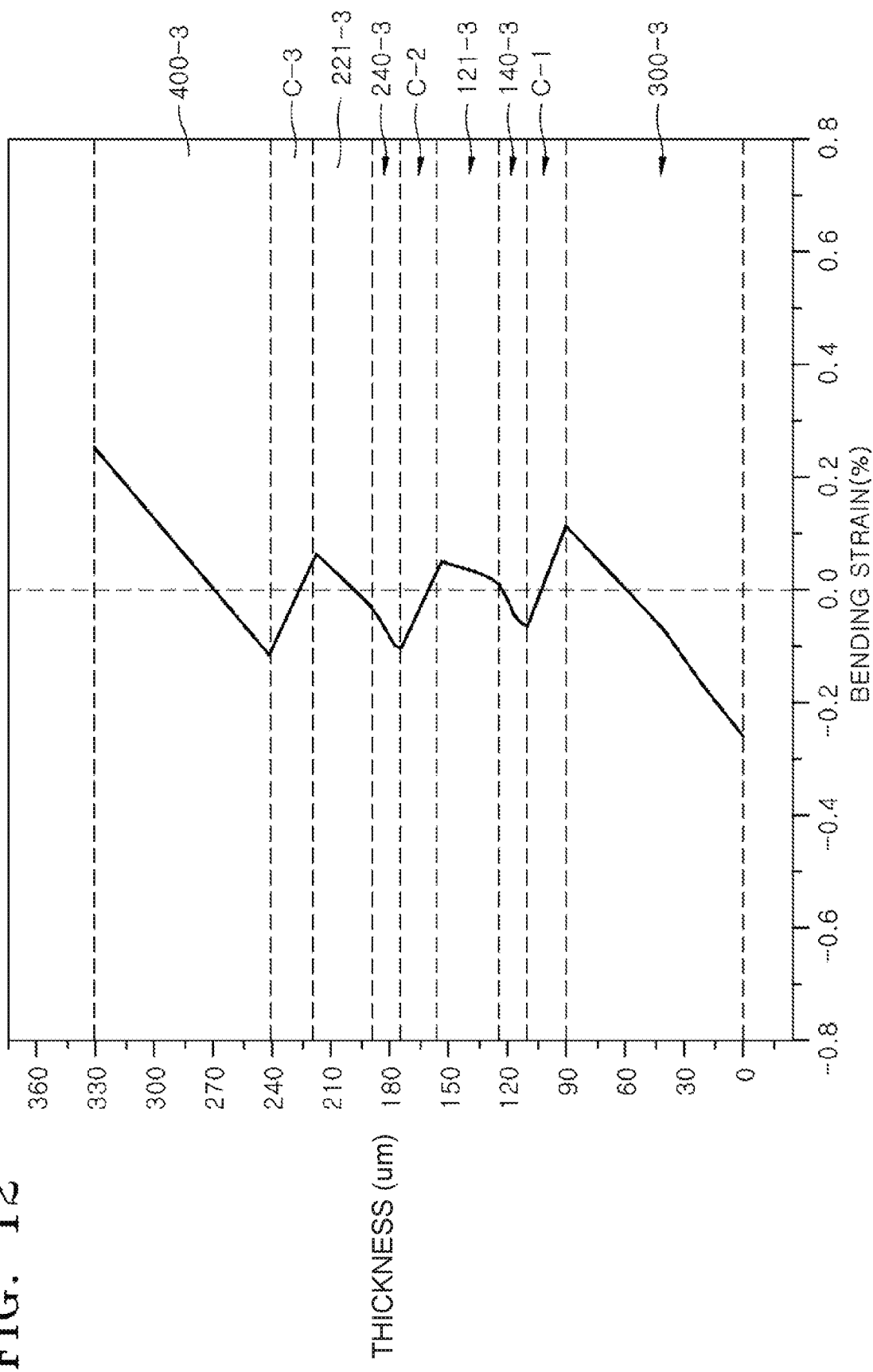
FIG. 12 is a graph illustrating simulation results of a bending strain of a stack package according to an embodiment.

FIG. 12 is a graph illustrating simulation results of a bending strain of a stack package according to an embodiment. In the graph of FIG. 12, the abscissa indicates a bending strain and the ordinate indicates a thickness of the stack package.

The stack package showing the simulation results of FIG. 12 may include a first silicone resin layer C-1, a first redistributed line structure 140-3, a first semiconductor die 121-3, a second silicone resin layer C-2, a second redistributed line structure 240-3, a third semiconductor die 221-3, a third silicon resin layer C-3 and a second flexible substrate 400-3 which are sequentially stacked on a first flexible substrate 300-3. The stack package used in the simulation results illustrated in FIG. 12 may have substantially the same structure as the stack package 10 illustrated in FIG. 1.

The simulation results of FIG. 12 exhibit a plurality of neutral planes existing in the structure of the stack package. That is, it may be understood that the neutral planes having the bending strain of zero percent are located in the first flexible substrate 300-3, the first silicone resin layer C-1, the first redistributed line structure 140-3, the second silicone resin layer C-2, the third semiconductor die 221-3, the third silicone resin layer C-3 and the second flexible substrate 400-3, respectively. As such, since the plurality of neutral planes exist in the stack package, the stack package may warp or bend without generation of cracks when an external force is applied to the stack package.

According to the embodiments described above, a flexible bridge die may be disposed between two adjacent semiconductor dies to provide a sub-package. The sub-package may be repeatedly stacked to provide a stack package. The stack package may have a flexible property.

The stack package may be realized to include a plurality of semiconductor dies vertically stacked and to have a flexible property. Thus, the stack package may warp or bend without generation of cracks when an external force is applied to the stack package. The flexible property of the stack package may be due to the presence of the flexible bridge die. Since the stack package is flexible, it may be possible to effectively suppress generation of cracks in the semiconductor dies which are vertically stacked when the stack package warps or bends. Since the plurality of semiconductor dies are vertically stacked and the semiconductor dies are located at both sides of the flexible bridge die, it may be possible to realize a flexible stack package having a large storage capacity.

Figure 13:
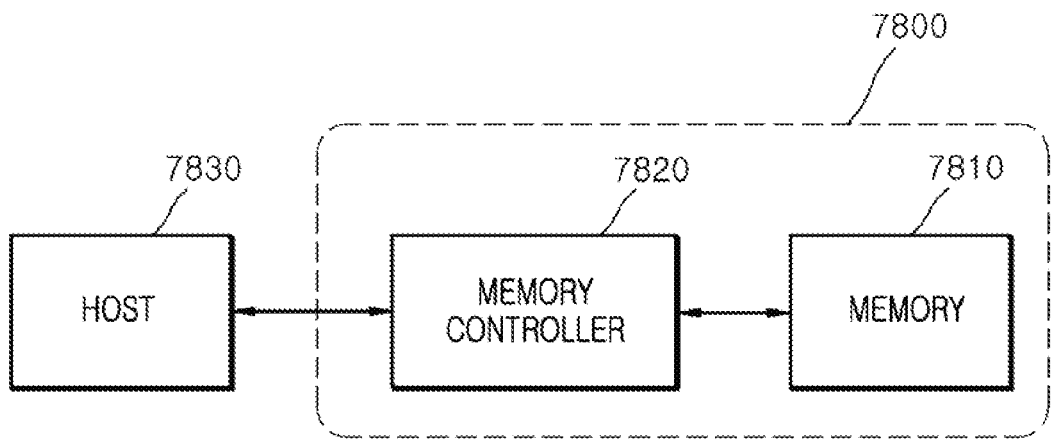
FIG. 13 is a block diagram illustrating an electronic system employing a memory card including at least one of stack packages according to various embodiments.

FIG. 13 is a block diagram illustrating an electronic system including a memory card 7800 employing at least one of the stack packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the stack packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 14:
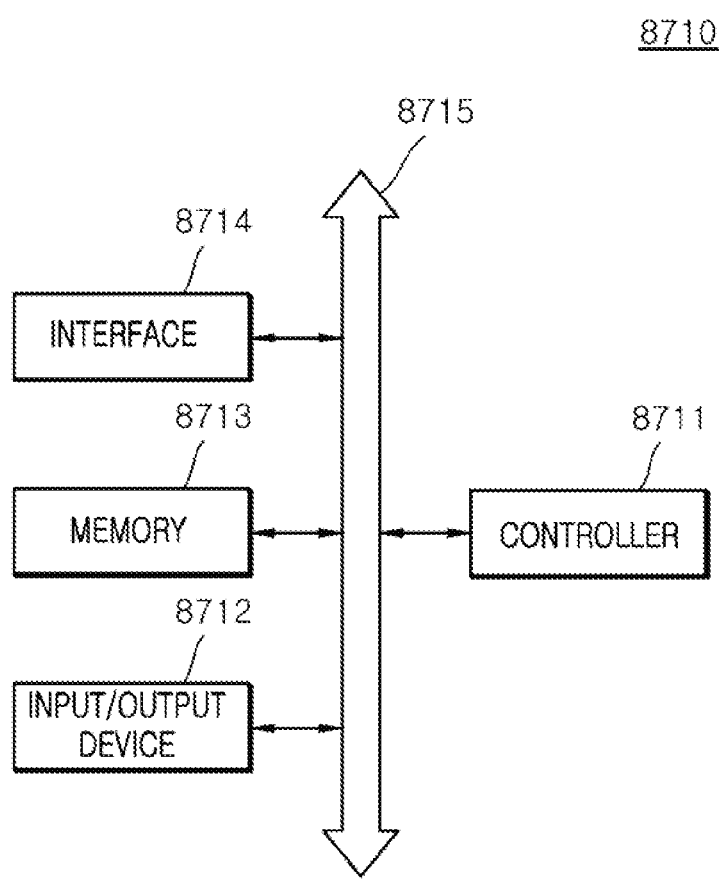
FIG. 14 is a block diagram illustrating another electronic system including at least one of stack packages according to various embodiments.

FIG. 14 is a block diagram illustrating an electronic system 8710 including at least one of the stack packages according to the embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the stack packages according to the embodiments of the present disclosure.

The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:
1. A stack package comprising:
a first flexible substrate and a second flexible substrate which are vertically spaced apart from each other;
a first sub-package disposed between the first and second flexible substrates;
a second sub-package disposed between the first sub-package and the second flexible substrate;
inner connectors electrically connecting the first sub-package to the second sub-package; and
an outer polymeric encapsulating layer filling a space between the first and second flexible substrates to encapsulate the first and second sub-packages,
wherein the first sub-package comprises:
first and second semiconductor dies disposed on the first flexible substrate to be spaced apart from each other;
a first flexible bridge die disposed between the first and second semiconductor dies;
a first inner polymeric encapsulating layer encapsulating the first and second semiconductor dies and the first flexible bridge die;
first redistributed lines electrically connecting the first semiconductor die to the first flexible bridge die; and second redistributed lines electrically connecting the second semiconductor die to the first flexible bridge die, and wherein the inner connectors electrically connect the first flexible bridge die to the second sub-package.

2. The stack package of claim 1, further comprising outer connectors attached to the first flexible substrate, wherein the first flexible substrate comprises interconnection lines that electrically connect the first flexible bridge die to the outer connectors.

3. The stack package of claim 1, wherein the second flexible substrate comprises a reinforcement pattern that reinforces stiffness or modulus of elasticity of the second flexible substrate.

4. The stack package of claim 3, wherein the reinforcement pattern comprises a metal layer.

5. The stack package of claim 1, wherein the second flexible substrate comprises a polymer layer comprising a polyimide material.

6. The stack package of claim 1, wherein the first inner polymeric encapsulating layer comprises a silicone resin material.

7. The stack package of claim 1, wherein the outer polymeric encapsulating layer comprises a silicone resin material.

8. The stack package of claim 1, wherein the outer polymeric encapsulating layer extends to fill a space between the first and second sub-packages as well as a space between the first sub-package and the first flexible substrate.

9. The stack package of claim 1, further comprising:
first supporters disposed between the first sub-package and the first flexible substrate to support the first sub-package; and
second supporters disposed between the first sub-package and the second sub-package to be spaced apart from the inner connectors and to support the second sub-package.

10. The stack package of claim 9,
wherein the first supporters are polymeric balls attached to both edges of the first sub-package; and
wherein the second supporters are polymeric balls attached to both edges of the second sub-package.

11. The stack package of claim 1, wherein the first flexible bridge die comprises:
a first flexible bridge die body;
first through vias and second via through vias penetrating the first flexible bridge die body; and
first post bumps and second post bumps connected to top ends of the first and second through vias, respectively, in a one-to-one manner, the first post bumps and second post bumps protruding from a top surface of the first flexible bridge die body.

12. The stack package of claim 11, wherein the first flexible bridge die body comprises a polyimide layer.

13. The stack package of claim 11,
wherein the first redistributed lines extend to electrically connect bottom ends of the first through vias to the first semiconductor die; and
wherein the second redistributed lines extend to electrically connect bottom ends of the second through vias to the second semiconductor die.

14. The stack package of claim 11, wherein the second sub-package comprises:
third and fourth semiconductor dies disposed on the first sub-package to be spaced apart from each other;

a second flexible bridge die disposed between the third and fourth semiconductor dies and electrically connected to the first and second post bumps;
a second inner polymeric encapsulating layer encapsulating the third and fourth semiconductor dies and the second flexible bridge die;
third redistributed lines electrically connecting the third semiconductor die to the second flexible bridge die; and
fourth redistributed lines electrically connecting the fourth semiconductor die to the second flexible bridge die.

15. The stack package of claim 14, wherein the second flexible bridge die comprises:
a second flexible bridge die body;
third through vias and fourth through vias penetrating the second flexible bridge die body; and
third post bumps and fourth post bumps connected to top ends of the third and fourth through vias, respectively, in a one-to-one manner, the third and fourth post bumps protruding from a top surface of the second flexible bridge die body.

16. The stack package of claim 15,
wherein the third redistributed lines extend to electrically connect bottom ends of the third through vias to the third semiconductor die; and
wherein the fourth redistributed lines extend to electrically connect bottom ends of the fourth through vias to the fourth semiconductor die.

17. The stack package of claim 15,
wherein the third through vias are located to overlap with the first through vias in a one-to-one manner; and
wherein the fourth through vias are located to overlap with the second through vias in a one-to-one manner.

18. The stack package of claim 15,
wherein the third through vias are located to overlap with the first post bumps in a one-to-one manner; and
wherein the fourth through vias are located to overlap with the second post bumps in a one-to-one manner.

19. A stack package comprising:
a first sub-package;
a second sub-package stacked on the first sub-package;
inner connectors electrically connecting the first sub-package to the second sub-package; and
an outer polymeric encapsulating layer encapsulating the first and second sub-packages,
wherein the first sub-package comprises:
first and second semiconductor dies disposed to be spaced apart from each other;
a first flexible bridge die disposed between the first and second semiconductor dies;
a first inner polymeric encapsulating layer encapsulating the first and second semiconductor dies and the first flexible bridge die;
first redistributed lines electrically connecting the first semiconductor die to the first flexible bridge die; and
second redistributed lines electrically connecting the second semiconductor die to the first flexible bridge die, and
wherein the inner connectors electrically connect the first flexible bridge die to the second sub-package.

20. A stack package comprising:
a first sub-package including first and second semiconductor dies spaced apart from each other by a first flexible bride die disposed between the first and second semiconductor dies, first redistributed lines electrically connecting the first semiconductor die to the first flexible bridge die, and second redistributed line electrically connecting the second semiconductor die to the first flexible bridge die; and first supporters attached to both edges of the first sub-package.

* * * * *